United States Patent
Chang et al.

[11] Patent Number: 6,069,091
[45] Date of Patent: May 30, 2000

[54] IN-SITU SEQUENTIAL SILICON CONTAINING HARD MASK LAYER/ SILICON LAYER PLASMA ETCH METHOD

[75] Inventors: Fa-Yuan Chang, Taipei; Ming-Yeon Hung, Hsin-chu, both of Taiwan

[73] Assignee: Taiwan Semiconductor Manufacturing Company, Ltd., Hsin-Chu, Taiwan

[21] Appl. No.: 08/999,205

[22] Filed: Dec. 29, 1997

[51] Int. Cl.$^7$ .................................................. H01L 21/302
[52] U.S. Cl. ......................... 438/719; 438/696; 438/700; 438/723; 438/724; 438/743; 438/744
[58] Field of Search ................................. 438/696, 700, 438/719, 723, 724, 743, 744

[56] References Cited

U.S. PATENT DOCUMENTS

| | | | |
|---|---|---|---|
| 5,817,579 | 10/1998 | Ko et al. | 438/740 |
| 5,830,807 | 11/1998 | Matsunaga et al. | 438/714 |

*Primary Examiner*—Janet Baxter
*Assistant Examiner*—Amanda C. Walke
*Attorney, Agent, or Firm*—George O. Saile; Stephen B. Ackerman; Alek P. Szecsy

[57] ABSTRACT

A method for etching a silicon layer within a microelectronics fabrication. There is first provided a substrate employed within a microelectronics fabrication. There is then formed over the substrate a blanket silicon layer. There is then formed upon the blanket silicon layer a blanket silicon containing hard mask layer, where the blanket silicon containing hard mask layer is formed from a silicon containing material chosen from the group of silicon containing materials consisting of silicon oxide materials, silicon nitride materials, silicon oxynitride materials and composites of silicon oxide materials, silicon nitride materials and silicon oxynitride materials. There is then formed upon the blanket silicon containing hard mask layer a patterned photoresist layer. There is then etched through a first plasma etch method the blanket silicon containing hard mask layer to form a patterned silicon containing hard mask layer while employing the patterned photoresist layer as a first etch mask layer. The first plasma etch method employs a first etchant gas composition comprising a first fluorine and carbon containing etchant source gas and a first bromine containing etchant source gas. Finally, there is then etched in-situ through a second plasma etch method the blanket silicon layer to form an at least partially etched silicon layer while employing the patterned photoresist layer and the patterned silicon containing hard mask layer as a second etch mask. The second plasma etch method employs a second etchant gas composition comprising a second fluorine and carbon containing etchant source gas, a second bromine containing etchant source gas and a chlorine containing etchant source gas.

8 Claims, 3 Drawing Sheets

IN-SITU SEQUENTIAL SILICON CONTAINING HARD MASK LAYER/ SILICON LAYER PLASMA ETCH METHOD

BACKGROUND OF THE INVENTION

1. Field of the Invention

The present invention relates generally to methods for etching silicon layers while employing silicon containing hard mask layers within microelectronics fabrications. More particularly, the present invention relates to methods for etching with smooth sidewall profile silicon layers while employing silicon containing hard mask layers within microelectronics fabrications.

2. Description of the Related Art

As integrated circuit integration levels have increased and integrated circuit device and conductor element dimensions have decreased, it has become increasingly important to form separating adjoining active semiconductor regions of a semiconductor substrate isolation regions which are substantially co-planar with those adjoining active semiconductor regions of the semiconductor substrate. Isolation regions which are substantially co-planar with adjoining active semiconductor regions of a semiconductor substrate are desirable within advanced integrated circuit microelectronics fabrication since such substantially co-planar isolation regions and active semiconductor regions provide a nominally planar surface which optimizes a reduced depth of focus typically encountered within an advanced photoexposure apparatus employed in defining advanced integrated circuit devices and advanced conductor elements of reduced linewidths upon or over those substantially co-planar isolation regions and active semiconductor regions within an advanced integrated circuit microelectronics fabrication.

When forming within an advanced integrated circuit microelectronics fabrication an isolation region substantially co-planar with an adjoining active semiconductor region of a semiconductor substrate, it is common in the art of advanced integrated circuit microelectronics fabrication to employ methods such as shallow trench isolation (STI) methods and recessed oxide isolation (ROI) methods when forming the isolation region. Shallow trench isolation (STI) methods and recessed oxide isolation (ROI) methods typically provide that a shallow trench is first formed within the semiconductor substrate while employing a composite etch mask layer formed of a patterned silicon nitride layer overlying a patterned pad oxide layer formed upon the semiconductor substrate. The composite etch mask layer is then subsequently employed as an oxidation mask layer when exposed portions of the shallow trench are at least partially thermally oxidized to form at least a thermal silicon oxide trench liner layer within the shallow trench.

While shallow trench isolation (STI) methods and recessed oxide isolation (ROI) methods are thus desirable within the art of advanced integrated circuit microelectronics fabrication, shallow trench isolation (STI) methods and recessed oxide isolation (ROI) methods are nonetheless not entirely without problems within advanced integrated circuit microelectronics fabrication. In particular, since it is common in the art of integrated circuit microelectronics fabrication to form upon a semiconductor substrate a composite patterned silicon nitride layer/patterned silicon oxide layer etch mask/oxidation mask layer through a first plasma etch method independent of a second plasma etch method employed in forming a shallow trench within the semiconductor substrate while employing the composite patterned silicon nitride layer/patterned silicon oxide layer as the etch mask layer, there is in general an inefficient use of integrated circuit microelectronics fabrication tooling and materials when forming shallow trenches within semiconductor substrates when employing composite patterned silicon nitride layer/patterned silicon oxide layer etch mask/oxidation mask layers.

In addition, it is also recognized in the art of integrated circuit microelectronics fabrication that sidewall profiles of trenches formed within semiconductor substrates through conventional methods which employ a first plasma etch method in forming a composite patterned silicon nitride layer/patterned silicon oxide layer etch mask layer upon a semiconductor substrate and an independent second plasma etch method in forming a trench within the semiconductor substrate while employing the composite patterned silicon nitride layer/patterned silicon oxide layer as an etch mask layer are often rough.

Inefficient use of integrated circuit microelectronics fabrication tooling and materials is undesirable within advanced integrated circuit microelectronics fabrication since integrated circuit microelectronics fabrication costs are thus increased. Similarly, rough sidewall profiles of shallow trenches formed within semiconductor substrates within integrated circuit microelectronics fabrications are also undesirable since such rough sidewall profiles may impede formation of isolation regions with optimal isolation characteristics within those shallow trenches and thus influence operating parameters of integrated circuit devices formed within adjoining active regions of a semiconductor substrate separated by the shallow trenches.

It is thus desirable in the art of advanced integrated circuit microelectronics fabrication to provide shallow trench isolation (STI) methods and recessed oxide isolation (ROI) methods through which there may efficiently, economically and with smooth sidewall profile be formed trenches within silicon semiconductor substrates while employing composite patterned silicon nitride layer/patterned silicon oxide layer etch mask/oxidation mask layers. It is towards that goal that the present invention is most specifically directed.

In a more general sense, it is also towards the goal of efficiently and economically forming an at least partially etched silicon layer within a microelectronics fabrication while employing a patterned silicon containing hard mask layer as an etch mask layer when forming the at least partially etched silicon layer, while simultaneously providing a smooth sidewall profile of the at least partially etched silicon layer, that the present invention is more generally directed.

Methods and materials through which structures such as trenches may be etched within semiconductor substrates are known in the art of integrated circuit microelectronics fabrication.

For example, Goth et al., in U.S. Pat. No. 4,534,826 discloses a method for etching a trench within a semiconductor substrate, where the method employs in addition to a conventional blanket first oxide mask layer and a patterned photoresist layer successively formed upon the semiconductor substrate, a blanket organic polymer layer having formed thereupon a blanket second oxide or nitride layer interposed between the blanket first oxide mask layer and the patterned photoresist layer. Through the method there may be formed through successive patterning of the blanket second oxide or nitride layer, the blanket organic polymer layer and the blanket first oxide layer a trench within the semiconductor substrate, where the trench has substantially perfectly vertical sidewalls.

In addition, Tsang, in U.S. Pat. No. 4,666,555 discloses a plasma etch method for etching a silicon semiconductor material, where the plasma etch method employs a trifluoromethane etchant gas in conjunction with a sulfur hexafluoride etchant gas. By controlling the relative concentration of trifluoromethane etchant gas with respect to the sulfur hexafluoride etchant gas within the plasma etch method a degree of anisotropic character of the plasma etch method may be controlled.

Finally, Drage et al., in U.S. Pat. No. 4,857,138 discloses a plasma etch method for etching a relatively deep trench within a single crystal silicon wafer. The method employs an etchant gas composition comprising fluorotrichloromethane and an inert gas to form the relatively deep trench with at least nearly vertical sidewalls, with improved image transfer and with a rapid etch rate.

Desirable in the art are additional methods and materials through which silicon layers within microelectronics fabrications may be at least partially etched while employing patterned silicon containing hard mask layers, to efficiently and economically provide at least partially etched silicon layers with smooth sidewall profiles. More particularly desirable are methods and materials through which silicon layers and silicon substrates within integrated circuit microelectronics fabrications may be at least partially etched while employing patterned silicon containing hard mask layers to efficiently and economically provide at least partially etched silicon layers or silicon substrates with smooth sidewall profiles. It is towards the foregoing objects that the present invention is directed.

SUMMARY OF THE INVENTION

A first object of the present invention is to provide a method for at least partially etching within a microelectronics fabrication a silicon layer while employing a patterned silicon containing hard mask layer.

A second object of the present invention is to provide a method in accord with the first object of the present invention where the at least partially etched silicon layer so formed is formed efficiently, economically and with a smooth sidewall profile.

A third object of the present invention is to provide a method in accord with the first object of the present invention or the second object of the present invention, wherein the silicon layer is a silicon semiconductor substrate and wherein the at least partially etched silicon semiconductor substrate has a trench formed therein.

A fourth object of the present invention is to provide a method in accord with the first object of the present invention, the second object of the present invention or the third object of the present invention, which method is readily manufacturable.

In accord with the objects of the present invention, there is provided by the present invention a method for at least partially etching a silicon layer within a microelectronics fabrication while employing a silicon containing hard mask layer when at least partially etching the silicon layer. To practice the method of the present invention, there is first provided a substrate employed within a microelectronics fabrication. There is then formed over the substrate a blanket silicon layer. There is then formed upon the blanket silicon layer a blanket silicon containing hard mask layer, where the blanket silicon containing hard mask layer is formed from a silicon containing material chosen from the group of silicon containing materials consisting of silicon oxide materials, silicon nitride materials, silicon oxynitride materials and composites of silicon oxide materials, silicon nitride materials and silicon oxynitride materials. There is then formed upon the blanket silicon containing hard mask layer a patterned photoresist layer. There is then etched through a first plasma etch method the blanket silicon containing hard mask layer to form a patterned silicon containing hard mask layer while employing the patterned photoresist layer as a first etch mask layer. The first plasma etch method employs a first etchant gas composition comprising a first fluorine and carbon containing etchant source gas and a first bromine containing etchant source gas. Finally, there is then etched in-situ through a second plasma etch method the blanket silicon layer to form an at least partially etched silicon layer while employing the patterned photoresist layer and the patterned silicon containing hard mask layer as a second etch mask layer. The second plasma etch method employs a second etchant gas composition comprising a second fluorine and carbon containing etchant source gas, a second bromine containing etchant source gas and a chlorine containing etchant source gas.

The present invention provides a method for at least partially etching within a microelectronics fabrication a silicon layer while employing a patterned silicon containing hard mask layer, where the at least partially etched silicon layer so formed is formed efficiently, economically and with smooth sidewall profile. The method of the present invention realizes the foregoing objects by employing: (1) a first plasma etch method employing a first carbon and fluorine containing etchant source gas and a first bromine containing etchant source gas while employing a patterned photoresist layer as a first etch mask layer for forming from a blanket silicon containing hard mask layer a patterned silicon containing hard layer formed upon a blanket silicon layer in turn formed over a substrate employed within a microelectronics fabrication; and (2) an in-situ second plasma etch method employing a second carbon and fluorine containing etchant source gas, a second bromine containing etchant source gas and a chlorine containing etchant source gas for forming an at least partially etched silicon layer from the blanket silicon layer while employing the patterned photoresist layer and the patterned silicon containing hard mask layer as a second etch mask layer. Although the intimate mechanism through which there is formed through the method of the present invention an at least partially etched silicon layer with smooth sidewall profile is not entirely clear, it is nonetheless clear that an at least partially etched silicon layer formed through the in-situ method of the present invention is formed with smooth sidewall profile in comparison with an otherwise equivalent at least partially etched silicon layer formed through a method otherwise equivalent to the method of the present invention, but not undertaken in-situ. Similarly, by undertaking the first plasma etch method and the second plasma etch method within the method of the present invention sequentially in-situ, the method of the present invention is efficient and economical.

The method of the present invention may be employed where the silicon layer is a silicon semiconductor substrate and where the at least partially etched silicon semiconductor substrate has a trench formed therein. The method of the present invention does not discriminate with respect to the nature of the silicon layer or the nature of a microelectronics fabrication within which is formed an at least partially etched silicon layer from the silicon layer through the method of the present invention. Thus, the method of the present invention may be employed where the silicon layer is a discrete silicon layer within a microelectronics fabrication such as but not limited to an integrated circuit microelectronics fabrication, a solar cell microelectronics fabrication, a ceramic substrate microelectronics fabrication or a flat panel display microelectronics fabrication. In addition, the method of the present invention may also be employed where the silicon layer is a silicon semiconductor substrate within an integrated circuit microelectronics fabrication.

The method of the present invention is readily manufacturable. The method of the present invention employs: (1) a first plasma etch method employing a first etchant gas composition comprising a first fluorine and carbon containing etchant source gas and a first bromine containing etchant source gas; and (2) an in-situ second plasma etch method employing a second etchant gas composition comprising a second fluorine and carbon containing etchant source gas, a second bromine containing etchant source gas and a chlorine containing etchant source gas, for forming an at least partially etched silicon layer within a microelectronics fabrication. Since plasma etch methods are generally known in the arts of microelectronics fabrication, and it is the specific methods and materials of the present plasma etch method which provide at least in part the present invention, the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

Figure 1:
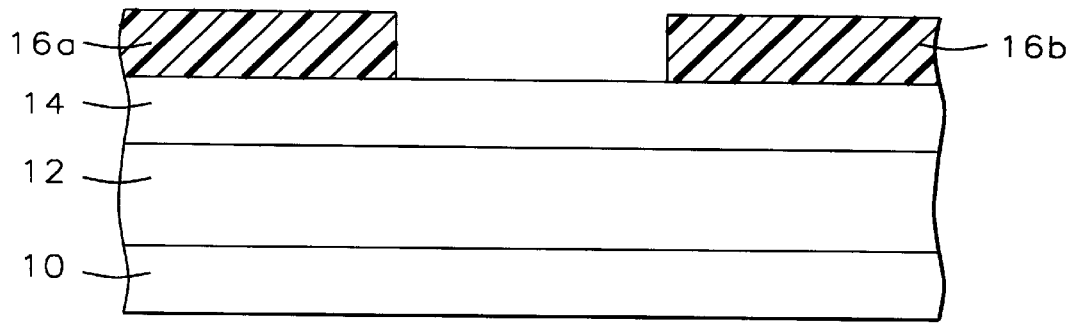
FIG. 1 to FIG. 3 show a series of schematic cross-sectional diagrams illustrating the results of progressive stages of forming in accord with a general embodiment of the present invention which comprises a first preferred embodiment of the present invention a partially etched silicon layer within a microelectronics fabrication.

The present invention provides a method for forming within a microelectronics fabrication an at least partially etched silicon layer from a silicon layer while employing a silicon containing hard mask layer in forming the at least partially etched silicon layer from the silicon layer, where the at least partially etched silicon layer so formed is formed efficiently, economically and with a smooth sidewall profile. The method of the present invention realizes the foregoing objects by employing: (1) a first plasma etch method employing a first carbon and fluorine containing etchant source gas and a first bromine containing etchant source gas while employing a patterned photoresist layer as a first etch mask layer for forming from a blanket silicon containing hard mask layer a patterned silicon containing hard mask layer formed upon a silicon layer in turn formed over a substrate employed within a microelectronics fabrication; and (2) an in-situ second plasma etch method employing a second carbon and fluorine containing etchant source gas, a second bromine containing etchant source gas and a chlorine containing etchant source gas for forming an at least partially etched silicon layer from the silicon layer while employing the patterned photoresist layer and the patterned silicon containing hard mask layer as a second etch mask layer. Although the intimate mechanism through which there is formed through the method of the present invention an at least partially etched silicon layer with a smooth sidewall profile is not entirely clear, it is nonetheless clear that an at least partially etched silicon layer formed through the in-situ method of the present invention is formed with a smooth sidewall profile in comparison with an otherwise equivalent at least partially etched silicon layer formed through a method otherwise equivalent to the method of the present invention, but not undertaken in-situ. The at least partially etched silicon layer formed through the method of the present invention is formed efficiently and economically since the first plasma etch method and the second plasma etch method are undertaken in-situ.

Although the method of the present invention is most likely to provide value when efficiently, economically and with smooth sidewall profile forming a trench within a silicon semiconductor substrate while employing a composite patterned silicon nitride layer/patterned silicon oxide layer etch mask/oxidation mask layer incident to forming within the semiconductor substrate a shallow trench isolation (STI) region or a recessed oxide isolation (ROI) region nominally coplanar with adjoining active semiconductor regions of the silicon semiconductor substrate separated by the shallow trench isolation (STI) region or the recessed oxide isolation (ROI) region, the method of the present invention may also be employed in forming at least partially etched silicon layers within locations other than silicon semiconductor substrate locations within microelectronics fabrications other than integrated circuit microelectronics fabrications. In that regard, the method of the present invention may be employed in forming at least partially etched silicon layers as discrete layers other than silicon semiconductor substrate layers within microelectronics fabrications including but not limited to integrated circuit microelectronics fabrications, solar cell microelectronics fabrications, ceramic substrate microelectronics fabrications and flat panel display microelectronics fabrications.

Figure 2:
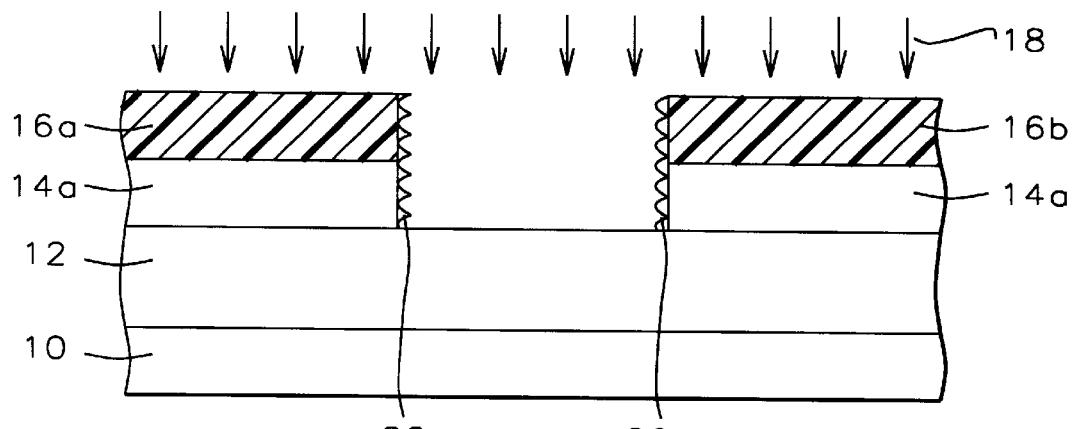
Figure 3:
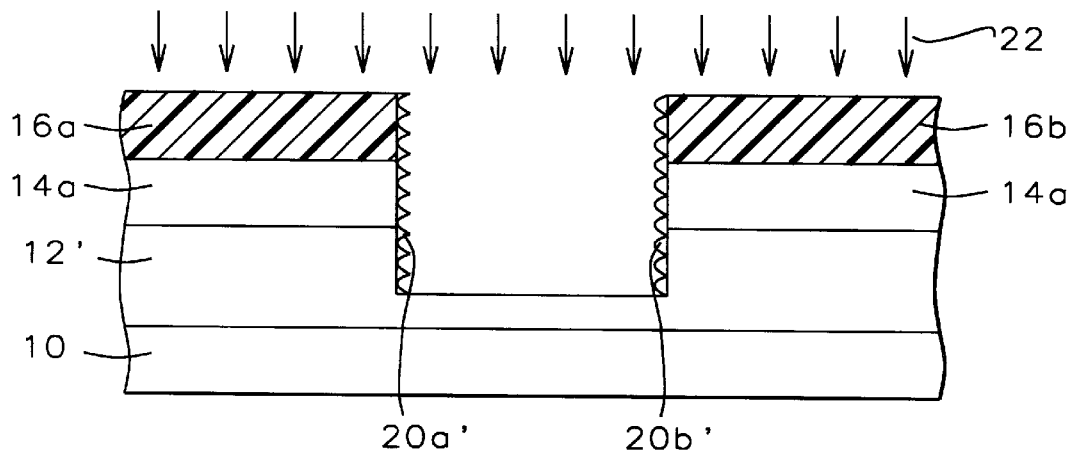

Referring now to FIG. 1 to FIG. 3, there is shown a series of schematic cross-sectional diagrams illustrating the results of progressive stages in forming in accord with a general embodiment of the present invention which comprises a first preferred embodiment of the present invention a partially etched silicon layer within a microelectronics fabrication. Shown in FIG. 1 is a schematic cross-sectional diagram of the microelectronics fabrication at an early stage in its fabrication.

Shown in FIG. 1 is a substrate 10 having formed thereover a blanket silicon layer 12 which in turn has formed thereupon a blanket silicon containing hard mask layer 14 which in turn has formed thereupon a pair of patterned photoresist layers 16a and 16b. Within FIG. 1, the substrate 10 is a substrate employed within a microelectronics fabrication, where the microelectronics fabrication is chosen from the group of microelectronics fabrications including but not limited to integrated circuit microelectronics fabrications, solar cell microelectronics fabrications, ceramic substrate microelectronics fabrications and flat panel display microelectronics fabrications. Although FIG. 1 illustrates the substrate 10 as a single layer, it is understood by a person skilled in the art that the substrate 10 as illustrated within FIG. 1 may also include a substrate having formed thereupon several additional conductor, semiconductor and/or dielectric layers as are common and appropriate to the microelectronics fabrication within which is employed the substrate 10.

With regard to the blanket silicon layer 12, the blanket silicon layer 12 may be formed from silicon materials as are common in the art of microelectronics fabrication, including but not limited to amorphous silicon materials, monocrystalline silicon materials and polycrystalline silicon materials, with or without minor concentrations of dopants incorporated therein, through methods as are similarly conventional in the art of forming silicon layers within microelectronics fabrication. Preferably, the blanket silicon layer 12 so formed is formed to a thickness appropriate to the microelectronics fabrication within which is formed the blanket silicon layer 12.

With respect to the blanket silicon containing hard mask layer 14, within the first preferred embodiment of the present invention, the blanket silicon containing hard mask layer 14 is formed from a silicon containing hard mask material chosen from the group of silicon containing hard mask materials including but not limited to silicon oxide materials, silicon nitride materials, silicon oxynitride materials and composites of silicon oxide materials, silicon nitride materials and silicon oxynitride materials. Such silicon containing hard mask materials may be formed through methods as are conventional in the art of microelectronics fabrication, including but not limited to chemical vapor deposition (CVD) methods, plasma enhanced chemical vapor deposition (PECVD) methods and physical vapor deposition (PVD) sputtering methods. Preferably, the blanket silicon containing hard mask layer 14 is formed to a thickness of from about 1000 to about 2000 angstroms.

Finally, with respect to the patterned photoresist layers 16a and 16b, the patterned photoresist layers 16a and 16b may be formed of any of several photoresist materials as are known in the art of microelectronics fabrication, including but not limited to photoresist materials chosen from the general groups of photoresist materials including but not limited to positive photoresist materials and negative photoresist materials. Preferably, the patterned photoresist layers 16a and 16b are formed upon the blanket silicon containing hard mask layer 14 to a thickness of from about 8000 to about 13000 angstroms each with a separation distance appropriate to an aperture width desired to be formed within or through the blanket silicon layer 12.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket silicon containing hard mask layer 14 has been patterned to form the patterned silicon containing hard mask layers 14a and 14b within a first plasma etch method employing a first plasma 18 while employing the patterned photoresist layers 16a and 16b as a first etch mask layer.

Within the first preferred embodiment of the present invention, the first plasma 18 employs a first etchant gas composition comprising a first carbon and fluorine containing etchant source gas and a first bromine containing etchant source gas, preferably without a chlorine containing etchant source gas. More preferably, the first plasma 18 employs a first etchant gas composition consisting essentially of a first carbon and fluorine containing etchant source gas and a first bromine containing etchant source gas. Preferably, the first carbon and fluorine containing etchant source gas is chosen from the group of first carbon and fluorine containing etchant source gases consisting of perfluorocarbons of no greater than three carbon atoms and hydrofluorocarbons of no greater than three carbon atoms. Preferably, the first bromine containing etchant source gas is selected from the group of bromine containing etchant source gases consisting of hydrogen bromide and bromine. Most preferably, the first plasma 18 employs a first etchant gas composition comprising carbon tetrafluoride and hydrogen bromide, along with suitable optional non-reactive diluent gases, as appropriate. Yet most preferably, the first plasma 18 employs a first etchant gas composition consisting essentially of carbon tetrafluoride and hydrogen bromide, along with suitable optional non-reactive diluent gases, as appropriate.

Preferably, the first plasma etch method also employs: (1) a reactor chamber pressure of about 30 to about 100 mtorr; (2) a radio frequency power of from about 500 to about 1000 watts at a radio frequency of 13.56 MHZ; (3) a substrate 10 temperature of from about 50 to about 80 degrees centigrade; (4) a carbon tetrafluoride flow rate of from about 40 to about 90 standard cubic centimeters per minute (sccm); and (5) a hydrogen bromide flow rate of from about 5 to about 20 standard cubic centimeters per minute (sccm), for a time period sufficient to completely etch through the blanket silicon containing hard mask layer 14 while simultaneously forming the patterned silicon containing hard mask layers 14a and 14b and exposing a portion of the blanket silicon layer 12.

As is illustrated in FIG. 2, there is simultaneously formed when etching the blanket silicon containing hard mask layer 14 to form the patterned silicon containing hard mask layers 14a and 14b with the first plasma 18 a pair of fluoropolymer residue layers 20a and 20b upon corresponding sidewalls of the patterned silicon containing hard mask layers 14a and 14b.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the blanket silicon layer 12 has been partially etched within a second plasma etch method employing a second plasma 22 to form a partially etched silicon layer 12' while employing the patterned photoresist layers 16a and 16b and the corresponding patterned silicon containing hard mask layers 14a and 14b as a second etch mask layer. As is illustrated within the schematic cross-sectional diagram of FIG. 3, the fluoropolymer residue layers 20a and 20b grow to form the corresponding extended fluoropolymer residue layers 20a' and 20b' when forming from the microelectronics fabrication whose schematic cross-sectional diagram is illustrated in FIG. 2 the microelectronics fabrication whose schematic cross-sectional diagram is illustrated in FIG. 3. Although within the first preferred embodiment of the present invention as illustrated in FIG. 3 the blanket silicon layer 12 is etched to form the partially etched silicon layer 12', within the method of the present invention it is plausible and not precluded that a blanket silicon layer, such as the blanket silicon layer 12, may be completely etched in forming a pair of patterned silicon layers.

Within the first preferred embodiment of the present invention, the second plasma 22 employs a second etchant gas composition preferably comprising a second fluorine and carbon containing etchant source gas, a second bromine containing etchant source gas and a chlorine containing etchant source gas. More preferably, the second plasma 22 employs a second etchant gas composition consisting essentially of a second carbon and fluorine containing etchant source gas, a second bromine containing etchant source gas and a chlorine containing etchant source gas. Similarly with the first plasma etch method, the second carbon and fluorine containing etchant source gas is chosen from the group of carbon and fluorine containing etchant source gases consisting of perfluorocarbons of no greater than three carbon atoms and hydrofluorocarbons of no greater than three carbon atoms. Similarly with the first plasma etch method, the second bromine containing etchant source gas is selected from the group of bromine containing etchant source gases consisting of hydrogen bromide and bromine. Preferably, the chlorine containing etchant source gas is chosen from the group of chlorine containing etchant source gases consisting of chlorine and hydrogen chloride. Most preferably, the second plasma etch method employs a second etchant gas composition comprising carbon tetrafluoride, hydrogen bromide and chlorine, along with suitable optional non-reactive diluent gases. Yet most preferably, the second plasma employs a second etchant gas composition consisting essentially of carbon tetrafluoride, hydrogen bromide and chlorine, along with suitable optional non-reactive diluent gases.

Preferably, the second plasma etch method also employs: (1) a reactor chamber pressure of about 50 to about 100 mtorr; (2) a radio frequency power of from about 600 to about 800 watts at a radio frequency of 13.56 MHZ; (3) a substrate 10 temperature of from about 50 to about 80 degrees centigrade; (4) a carbon tetrafluoride flow rate of from about 20 to about 50 standard cubic centimeters per minute (sccm); (5) a hydrogen bromide flow rate of from about 20 to about 100 standard cubic centimeters per minute (sccm); (6) a chlorine flow rate of from about 20 to about 100 standard cubic centimeters per minute (sccm); and (7) a 70/30 helium/oxygen v/v non-reactive diluent at a flow rate of from about 20 to about 50 standard cubic centimeters per minute (sccm), for a time period sufficient to at least partially etch through the blanket silicon layer 12 while simultaneously forming the partially etched silicon layer 12'.

Upon forming the microelectronics fabrication whose schematic cross-sectional diagram is illustrated in FIG. 3, there is efficiently and economically formed a microelectronics fabrication having formed therein the partially etched silicon layer 12' having a smooth sidewall profile. The microelectronics fabrication is formed efficiently and economically since the first plasma etch method and the second plasma etch method are undertaken sequentially in-situ within a single reactor chamber or within adjoining chambers of a multi-chamber cluster reactor tool, without ambient exposure. While not being limited to any one particular theory of operation as to why the method of the present invention provides at least partially etched silicon layers with smooth sidewalls, it is believed that the etchant source gases within the first plasma 18 and the second plasma 22 which provide the fluoropolymer residue layers 20a and 20b and the extended fluoropolymer residue layers 20a' and 20b', along with in-situ processing which precludes ambient exposure of the fluoropolymer residue layers 20a and 20b, provide stable fluoropolymer residue layers 20a and 20b, and stable extended fluoropolymer residue layers 20a' and 20b', which uniformly protect the sidewalls of the partially etched silicon layer 12' when forming the partially etched silicon layer 12', thus forming sidewalls within the partially etched silicon layer 12' which are smooth.

Figure 4:
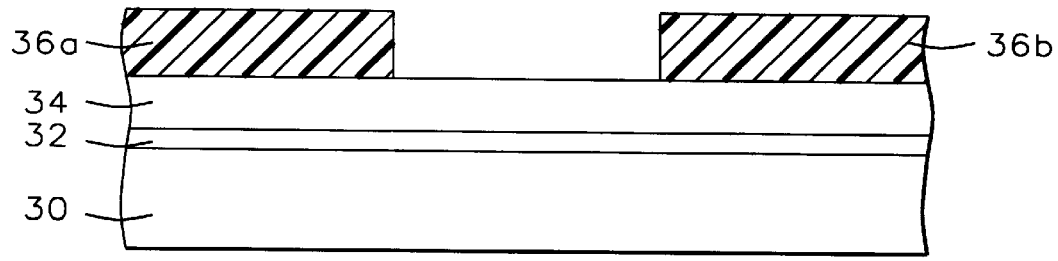
FIG. 4 to FIG. 8 show a series of schematic cross-sectional diagrams illustrating the results of progressive stages of forming in accord with a specific embodiment of the present invention which comprises a second preferred embodiment of the present invention an isolation region within a shallow trench within a silicon semiconductor substrate within an integrated circuit microelectronics fabrication.

Referring now to FIG. 4 to FIG. 8, there is shown a series of schematic cross-sectional diagrams illustrating the results of forming in accord with a more specific embodiment of the present invention which comprises a second preferred embodiment of the present invention a shallow trench isolation (STI) region within a silicon semiconductor substrate within an integrated circuit microelectronics fabrication. Shown in FIG. 4 is a schematic cross-sectional diagram of the integrated circuit microelectronics fabrication at an early stage in its fabrication.

Shown in FIG. 4 is a semiconductor substrate 30 having formed thereupon a blanket pad oxide layer 32 in turn having formed thereupon a blanket silicon nitride layer 34 which in turn has formed thereupon a pair of patterned photoresist layers 36a and 36b. Each of the foregoing substrate or layers within the second preferred embodiment of the present invention is conventional in the art of integrated circuit microelectronics fabrication.

For example, although it is known in the art of integrated circuit microelectronics fabrication that semiconductor substrates are available with either dopant polarity, various dopant concentrations and several crystallographic orientations, for the second preferred embodiment of the present invention, the semiconductor substrate 30 is preferably a (100) silicon semiconductor substrate having an N- or P-doping. As is understood by a person skilled in the art, the semiconductor substrate 30 as illustrated in FIG. 4 typically includes formed thereupon an epitaxial monocrystalline silicon layer of appropriate doping for a series of integrated circuit devices subsequently formed within and/or upon the semiconductor substrate 30.

Similarly, although it is also known in the art of integrated circuit microelectronics fabrication that oxide layers may be formed upon semiconductor substrates through methods including but not limited to thermally assisted growth methods, chemical vapor deposition (CVD) methods and physical vapor deposition (PVD) sputtering methods, for the second preferred embodiment of the present invention, the blanket pad oxide layer 32 is preferably formed upon the semiconductor substrate 30 through a thermally assisted growth method at a temperature of from about 700 to about 1000 degrees centigrade to form the blanket pad oxide layer 32 of thickness about 50 to about 200 angstroms upon the semiconductor substrate 30.

Similarly, although it is also known in the art of integrated circuit microelectronics fabrication that silicon nitride layers may be formed through methods including but not limited to chemical vapor deposition (CVD) methods and physical vapor deposition (PVD) sputtering methods, for the second preferred embodiment of the present invention, the blanket silicon nitride layer 34 is preferably formed upon the blanket pad oxide layer 32 through a chemical vapor deposition (CVD) method to form the blanket silicon nitride layer 34 of thickness about 1500 to about 2000 angstroms upon the blanket pad oxide layer 32. Within the second preferred embodiment of the present invention, the blanket pad oxide layer 32 and the blanket silicon nitride layer 34 form in the aggregate a blanket silicon containing hard mask layer which is patterned to form a patterned silicon containing hard mask layer employed as an etch mask layer in forming a trench within the semiconductor substrate 30.

Finally, the patterned photoresist layers 36a and 36b are preferably formed through methods, materials and dimensions analogous or equivalent to the methods, materials and dimensions employed in forming the patterned photoresist layers 16a and 16b within the microelectronics fabrication in accord with the first preferred embodiment of the present invention whose schematic cross-sectional diagrams are illustrated within FIG. 1 to FIG. 3.

Figure 5:
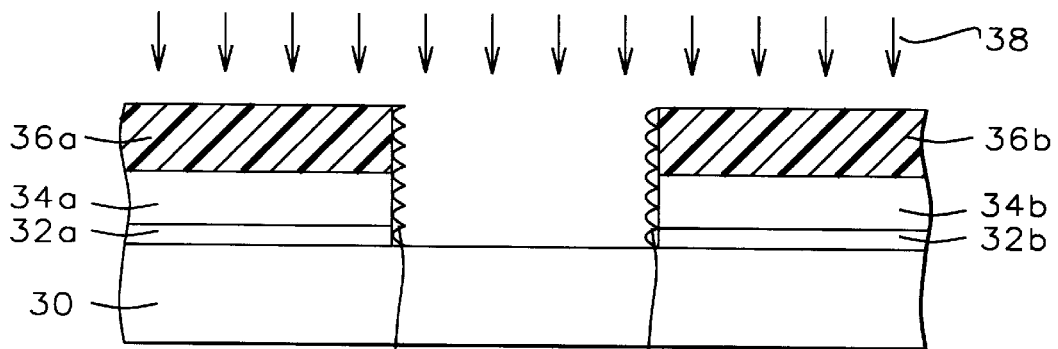

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein the blanket silicon nitride layer 34 and the blanket pad oxide layer 32 have been patterned to form the corresponding patterned silicon nitride layers 34a and 34b and the corresponding patterned pad oxide layers 32a and 32b through etching within a first plasma 38 while employing the patterned photoresist layers 36a and 36b as a first etch mask layer. Within the second preferred embodiment of the present invention, the first plasma 38 is preferably formed through methods and materials analogous or equivalent to the methods and material employed in forming the first plasma 18 with in the first preferred embodiment of the present invention as illustrated within the schematic cross-sectional diagram of FIG. 2. Analogously with the schematic cross-sectional diagram of FIG. 2, there is also formed a pair of fluoropolymer residue layers 40a and 40b adjoining the corresponding patterned silicon nitride layers 34a and 34b and the corresponding patterned pad oxide layers 32a and 32b.

Figure 6:
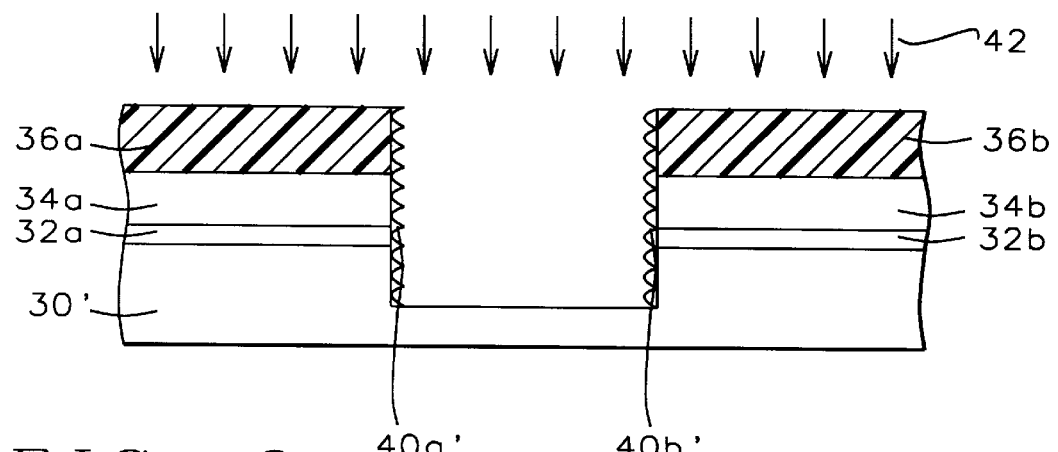

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein there has been formed a shallow trench within the semiconductor substrate 30, thus forming a partially etched semiconductor substrate 30', through etching of the semiconductor substrate 30 with a second plasma 42 while employing the patterned photoresist layers 36a and 36b, the patterned silicon nitride layers 34a and 34b and the patterned pad oxide layers 32a and 32b as a second etch mask layer. Within the second preferred embodiment of the present invention, the second plasma 42 is preferably formed through methods and materials analogous or equivalent to the methods and materials employed in forming the second plasma 22 within the first preferred embodiment of the present invention as illustrated within FIG. 3. Analogously with the schematic cross-sectional diagrams of FIG. 2 and FIG. 3, the fluoropolymer residue layers 40a and 40b as illustrated within the schematic cross-sectional diagram of FIG. 5 increase in length to form the extended fluoropolymer residue layers 40a' and 40b'. Similarly with the first preferred embodiment of the present invention, the first plasma etch method and the second plasma etch method within the second preferred embodiment of the present invention are undertaken sequentially in-situ within a single reactor chamber or within adjoining reactor chambers of a multi-chamber reactor tool, without ambient exposure.

Within the schematic cross-sectional diagram of FIG. 6, the shallow trench within the partially etched semiconductor substrate 30' is preferably formed to a depth of from about 3000 to about 4000 angstroms within the partially etched semiconductor substrate 30'. Typically and preferably, the shallow trench is also formed with a width of from about 0.18 to about 0.5 microns angstroms within the partially etched semiconductor substrate 30'.

Figure 7:
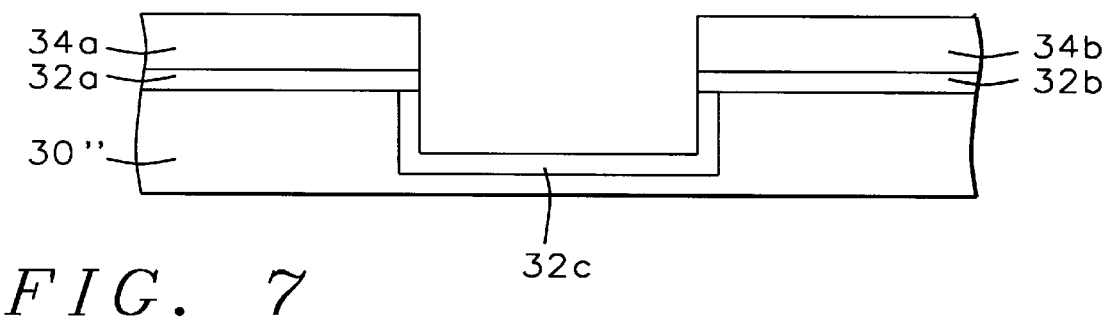

Referring now to FIG. 7, there is shown a schematic cross-sectional diagram illustrating the results of further processing of the integrated circuit microelectronics fabrication whose schematic cross-sectional diagram is illustrated in FIG. 6. Shown in FIG. 7 is a schematic cross-sectional diagram of an integrated circuit microelectronics fabrication otherwise equivalent to the integrated circuit microelectronics fabrication whose schematic cross-sectional diagram is illustrated in FIG. 6, but wherein: (1) the patterned photoresist layers 36a and 36b and the extended fluoropolymer residue layers 40a' and 40b' have been stripped from the integrated circuit microelectronics fabrication; and (2) the partially etched semiconductor substrate 30' has been thermally oxidized to form a thermally oxidized partially etched semiconductor substrate 30'' while simultaneously forming a thermal silicon oxide trench liner layer 32c within the shallow trench.

When forming the integrated circuit microelectronics fabrication whose schematic cross-sectional diagram is illustrated in FIG. 7 from the integrated circuit microelectronics fabrication whose schematic cross-sectional diagram is illustrated in FIG. 6, the patterned photoresist layers 36a and 36b and the extended fluoropolymer residue layers 40a' and 40b' may be stripped through methods as are conventional in the art, which will typically and preferably include wet chemical stripping methods, although dry plasma stripping methods may also be employed as an alternative or an adjunct to wet chemical stripping methods. Similarly, the thermal silicon oxide trench liner layer 32c is preferably formed within the integrated circuit microelectronics fabrication whose schematic cross-sectional diagram is illustrated in FIG. 7 through thermal oxidation methods and materials analogous or equivalent to the thermal oxidation methods and materials employed in forming the blanket pad oxide layer 32. Preferably, the thermal silicon oxide trench liner layer 32c so formed is formed to a thickness of from about 50 to about 200 angstroms.

Figure 8:
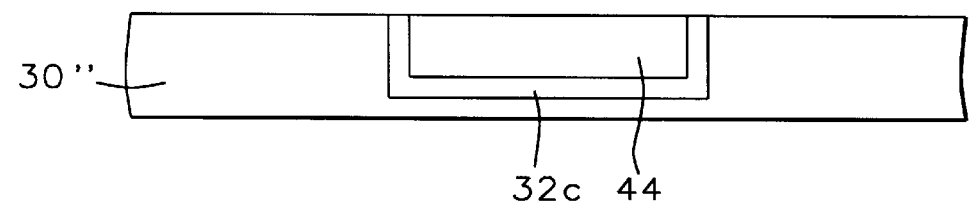

Referring now to FIG. 8, there is shown a schematic cross-sectional diagram illustrating the results of further processing of the integrated circuit microelectronics fabrication whose schematic cross-sectional diagram is illustrated in FIG. 7. Shown in FIG. 8 is a schematic cross-sectional diagram of an integrated circuit microelectronics fabrication otherwise equivalent to the integrated circuit microelectronics fabrication whose schematic cross-sectional diagram is illustrated in FIG. 7, but wherein: (1) the patterned silicon nitride layers 34a and 34b and the patterned pad oxide layers 32a and 32b have been stripped from the integrated circuit microelectronics fabrication; and (2) there is then formed upon the thermal silicon oxide trench liner layer 32c within the shallow trench an isolation region 44.

To form the integrated circuit microelectronics fabrication whose schematic cross-sectional diagram is illustrated in FIG. 8 from the integrated circuit microelectronics fabrication whose schematic cross-sectional diagram is illustrated in FIG. 7, the patterned silicon nitride layers 34a and 34b are first stripped from the integrated circuit microelectronics fabrication, typically and preferably within refluxing phosphoric acid. There is then formed upon the resulting integrated circuit microelectronics fabrication a blanket trench fill dielectric layer which is typically subsequently planarized through a chemical mechanical polish (CMP) planarizing method while employing the thermally oxidized partially etched semiconductor substrate 30" as a chemical mechanical polish (CMP) polish stop layer to form the isolation region 44 typically of silicon oxide upon the thermal silicon oxide trench liner layer 32c within the shallow trench.

Upon forming the integrated circuit microelectronics fabrication whose schematic cross-sectional diagram is illustrated in FIG. 8, there is efficiently and economically formed an integrated circuit microelectronics fabrication with reproducibly isolated active semiconductor regions of the thermally oxidized partially etched semiconductor substrate 30", since a shallow trench within which is formed the isolation region 44 is formed with a smooth sidewall profile.

EXAMPLES

There was obtained three series of (100) silicon semiconductor substrates and formed upon each semiconductor substrate within the three series of semiconductor substrates a silicon oxide pad oxide layer through a thermal oxidation method at a temperature of about 900 degrees centigrade to form a thermal silicon oxide pad oxide layer of thickness about 110 angstroms. Upon each thermal silicon oxide pad oxide layer was then formed a silicon nitride layer of thickness about 1760 angstroms through a low pressure chemical vapor deposition (LPCVD) method employing silane and ammonia as the silicon source material and the nitrogen source material, respectively. There was then formed upon each blanket silicon nitride layer a patterned photoresist layer formed from an SE-4202 deep ultraviolet (DUV) photoresist material. The patterned photoresist layers upon each of the blanket silicon nitride layers were formed of a thickness about 10000 angstroms to define rectangular apertures within the patterned photoresist layers.

A first series of semiconductor substrates within the three series of semiconductor substrates was then exposed to a two step plasma etch method for forming a series of shallow trenches within the first series semiconductor substrates. Within the first step of the two step plasma etch method there was employed a first plasma employing a first etchant gas composition consisting of carbon tetrafluoride, trifluoromethane, argon and oxygen. The first plasma etch method also employed: (1) a reactor chamber pressure of about 1.0 mtorr; (2) a radio frequency power of about 300 watts at a radio frequency of 13.56 MHZ; (3) a semiconductor substrate temperature of about 15 degrees centigrade; (4) a carbon tetrafluoride flow rate of about 15 standard cubic centimeters per minute (sccm); (5) a trifluoromethane flow rate of about 20 standard cubic centimeters per minute (sccm); (6) an argon flow rate of about 70 standard cubic centimeters per minute (sccm); and (7) an oxygen flow rate of about 40 standard cubic centimeters per minute, for a time period sufficient to reach the semiconductor substrate.

The second plasma etch method within the two step plasma etch method employed a second etchant gas composition consisting of hydrogen bromide, chlorine, helium/oxygen and carbon tetrafluoride. The second plasma etch method also employed: (1) a reactor chamber pressure of about 50 mtorr; (2) a radio frequency power of about 800 watts at a radio frequency of 13.56 MHZ; (3) a semiconductor substrate temperature of about 50 degrees centigrade; (4) a hydrogen bromide flow rate of about 100 standard cubic centimeters per minute; (5) a chlorine flow rate of about 20 standard cubic centimeters per minute (sccm); (6) a 70/30 helium/oxygen v/v flow rate of about 30 standard cubic centimeters per minute (sccm); and (7) a carbon tetrafluoride flow rate of about 20 standard cubic centimeters per minute (sccm), for a time period sufficient to etch a shallow trench of depth about 3500 angstroms within each silicon semiconductor substrate. For the first series of semiconductor substrates, the first plasma etch method and the second plasma etch method were not undertaken in-situ, but rather the first plasma etch method and the second plasma etch method were separated by an ambient air exposure of about 4 hours at room temperature.

A second series of the three series of semiconductor substrates was then etched within a two step plasma etch method which was otherwise equivalent to the two step plasm etch method employed in etching the first series of semiconductor substrates, but wherein the first plasma etch method employed a first etchant gas composition consisting of carbon tetrafluoride and hydrogen bromide rather than carbon tetrafluoride, trifluoromethane, argon and oxygen. The first plasma etch method also employed: (1) a reactor chamber pressure of about 50 mtorr; (2) a radio frequency power of about 800 watts at a radio frequency of 13.56 MHZ; (3) a carbon tetrafluoride flow rate of about 45 standard cubic centimeters per minute (sccm); and (4) a hydrogen bromide flow rate of about 10 standard cubic centimeters per minute (sccm), for a time period sufficient to reach the semiconductor substrate. For the second series of semiconductor substrates, the first plasma etch method and the second plasma etch method were not undertaken in-situ, but rather the first plasma etch method and the second plasma etch method were separated by an ambient air exposure of about 4 hours at room temperature.

A third of the three series of semiconductor substrates was then etched within a two step plasma etch method otherwise equivalent to the two step plasma etch method employed in etching the second series of semiconductor substrates, but wherein the first plasma etch method and the second plasma etch method within the two step plasma etch method were undertaken in-situ.

The patterned photoresist layers and any fluoropolymer residue layers remaining upon the semiconductor substrates within each of the three series of semiconductor substrates were then stripped from the semiconductor substrates through a wet chemical stripping method employing a wet chemical stripper conventional in the art of integrated circuit microelectronics fabrication.

The sidewall profiles of the trenches within the three series of semiconductor substrates were then measured through a scanning electron microscopy (SEM) measurement method. The results of the measurements are reported within Table I, where the profile taper is reported as degrees variation versus the horizontal plane of the semiconductor substrate.

TABLE I

| Example | First Etch | In-Situ | Profile Taper | Profile Texture |
| --- | --- | --- | --- | --- |
| 1 | CF4/CHF3/Ar/O2 | no | 82 +/−3 | rough |
| 2 | CF4/HBr | no | 82 +/−3 | rough |
| 3 | CF4/HBr | yes | 82 +/−3 | smooth |

As is seen from review of the data within Table I, an in-situ two step plasma etch method employing a carbon and fluorine containing etchant source gas and a bromine containing etchant source gas within the first plasma etch method of the two step plasma etch method efficiently and economically provides a smooth shallow trench sidewall profile when forming a shallow trench within a semiconductor substrate when employing a silicon containing hard mask layer in defining the trench, in comparison with: (1) an otherwise equivalent non in-situ two step plasma etch method which is otherwise conventional in the art of microelectronics fabrication; or (2) an otherwise equivalent non in-situ two step plasma etch method derived from the in-situ two step plasma etch method disclosed herein.

As is understood by a person skilled in the art, the preferred embodiments and examples of the present invention are illustrative of the present invention rather than limiting of the present invention. Revisions and modifications may be made to methods, materials, structures and dimensions through which is provided the preferred embodiments and examples of the present invention which still providing embodiments and examples which are within the spirit and scope of the present invention, as defined by the accompanying claims.

What is claimed is:

1. A method for etching a silicon layer within a microelectronics fabrication comprising:

providing a substrate employed within a microelectronics fabrication;

forming over the substrate a blanket silicon layer;

forming upon the blanket silicon layer a blanket silicon containing hard mask layer, the blanket silicon containing hard mask layer being formed from a silicon containing material chosen from the group of silicon containing materials consisting of silicon oxide materials, silicon nitride materials, silicon oxynitride materials and composites of silicon oxide materials, silicon nitride materials and silicon oxynitride materials;

forming upon the blanket silicon containing hard mask layer a patterned photoresist layer;

etching, through use of a first plasma etch method, the blanket silicon containing hard mask layer to form a patterned silicon containing hard mask layer while employing the patterned photoresist layer as a first etch mask layer, the first plasma etch method employing a first etchant gas composition comprising a first fluorine and carbon containing etchant source gas and a first bromine containing etchant source gas; and etching in-situ, through use of a second plasma etch method, the blanket silicon layer to form an at least partially etched silicon layer while employing the patterned photoresist layer and the patterned silicon containing hard mask layer as a second etch mask layer, the second plasma etch method employing a second etchant gas composition comprising a second fluorine and carbon containing etchant source gas, a second bromine containing etchant source gas and a chlorine containing etchant source gas, wherein by employing the first plasma etch method and the second plasma etch method in-situ rather than not in-situ the at least partially etched silicon layer is formed with an enhanced sidewall smoothness.

2. The method of claim 1 wherein the microelectronics fabrication is chosen from the group of microelectronics fabrications consisting of integrated circuit microelectronics fabrications, solar cell microelectronics fabrications, ceramic substrate microelectronics fabrications and flat panel display microelectronics fabrications.

3. The method of claim 1 wherein the blanket silicon layer is formed of a silicon material chosen from the group of silicon materials consisting of amorphous silicon materials, monocrystalline silicon materials and polycrystalline silicon materials.

4. The method of claim 1 wherein:

the first fluorine and carbon containing etchant source gas and the second fluorine and carbon containing etchant source gas are selected from the group of fluorine and carbon containing etchant source gases consisting of perfluorocarbons of no greater than three carbon atoms and hydrofluorocarbons of no greater than three carbon atoms;

the first bromine containing etchant source gas and the second bromine containing etchant source gas are selected from the group of bromine containing etchant source gases consisting of hydrogen bromide and bromine; and the chlorine containing etchant source gas is selected from the group of chlorine containing etchant source gases consisting of chlorine and hydrogen chloride.

5. The method of claim 1 wherein:

the first etchant gas composition comprises carbon tetrafluoride and hydrogen bromide; and the second etchant gas composition comprises carbon tetrafluoride, hydrogen bromide and chlorine.

6. A method for forming a trench within a silicon semiconductor substrate comprising:

providing a silicon semiconductor substrate;

forming upon the silicon semiconductor substrate a blanket silicon containing hard mask layer, the blanket silicon containing hard mask layer being formed from a silicon containing material chosen from the group of silicon containing materials consisting of silicon oxide materials, silicon nitride materials, silicon oxynitride materials and composites of silicon oxide materials, silicon nitride materials and silicon oxynitride materials;

forming upon the blanket silicon containing hard mask layer a patterned photoresist layer;

etching, through use of a first plasma etch method, the blanket silicon containing hard mask layer to form a patterned silicon containing hard mask layer while employing the patterned photoresist layer as a first etch mask layer, the first plasma etch method employing a first etchant gas composition comprising a first fluorine and carbon containing etchant source gas and a first bromine containing etchant source gas; and etching in-situ, through use of a second plasma etch method, the silicon semiconductor substrate to form a trench within the silicon semiconductor substrate while employing the patterned photoresist layer and the patterned silicon containing hard mask layer as a second etch mask layer, the second plasma etch method employing a second etchant gas composition comprising a second fluorine and carbon containing etchant source gas, a second bromine containing etchant source gas and a chlorine containing etchant source gas, wherein by employing the first plasma etch method and the second plasma etch method in-situ rather than not in-situ the trench is formed with an enhanced sidewall smoothness.

7. The method of claim 6 wherein:

the first fluorine and carbon containing etchant source gas and the second fluorine and carbon containing etchant source gas are selected from the group of fluorine and carbon containing etchant source gases consisting of perfluorocarbons having no greater than three carbon atoms and hydrofluorocarbons having no greater than three carbon atoms;

the first bromine containing etchant source gas and the second bromine containing etchant source gas are selected from the group of bromine containing etchant source gases consisting of hydrogen bromide and bromine; and the chlorine containing etchant source gas is selected from the group of chlorine containing etchant source gases consisting of chlorine and hydrogen chloride.

8. The method of claim 6 wherein:

the first etchant gas composition comprises carbon tetrafluoride and hydrogen bromide; and the second etchant gas composition comprises carbon tetrafluoride, hydrogen bromide and chlorine.

* * * * *